United States Patent [19]
Takeda et al.

[11] Patent Number: 5,543,742
[45] Date of Patent: Aug. 6, 1996

[54] PHASE SHIFTING CIRCUIT

[75] Inventors: Isoshi Takeda; Yoshikazu Shimada, both of Kyoto, Japan

[73] Assignee: Rohm Co., Ltd., Kyoto, Japan

[21] Appl. No.: 305,877

[22] Filed: Sep. 15, 1994

[30]     Foreign Application Priority Data

Sep. 16, 1993   [JP]   Japan ................................. 5-229749

[51] Int. Cl.$^6$ ............................... H03K 3/00; H03B 5/12
[52] U.S. Cl. ..................... 327/232; 327/237; 327/238; 327/246; 327/254; 331/108 B
[58] Field of Search ................................ 327/232, 237, 327/238, 246, 254, 2, 244; 330/252, 107; 331/25, 108 B

[56]              References Cited

U.S. PATENT DOCUMENTS 3,983,512   9/1976   Lipscombe .............................. 327/237
4,866,397   9/1989   Kimyacioglu ........................... 327/237
5,298,870   3/1994   Cytera et al. .......................... 331/108 B
5,317,200   5/1994   Nishiyama ............................... 327/237

Primary Examiner—David C. Nelms
Assistant Examiner—Trong Phan
Attorney, Agent, or Firm—Nikaido, Marmelstein, Murray & Oram LLP

[57]                ABSTRACT

A phase shifting circuit has an oscillation circuit. The oscillation circuit is provided with a charging and discharging capacitor at which the oscillation signal is generated. The oscillation signal has a constant level period and a saw tooth wave period. A valve of current flowing through the capacitor is changed in the middle of the saw tooth wave period by an input signal. An output of the phase shifting circuit is phase-shifted by 90° with respect to the input signal.

6 Claims, 6 Drawing Sheets

5,543,742

PHASE SHIFTING CIRCUIT

BACKGROUND OF THE INVENTION

1. Field of the Invention

The present invention relates to a phase shifting circuit, and more particularly, to a phase shifting circuit necessary for a quadrature detection of an FM signal.

2. Description of the Prior Art

In a conventional quadrature detector used in a frequency modulation (FM) radio receiver, as shown in FIG. 1, a received FM radio signal is transmitted through two lines 101a and 101b from an intermediate frequency (IF) circuit 100 which converts the frequency of the FM radio signal into an FM intermediate frequency. Through the line 101a, the signal is transmitted directly to a multiplier 103, whereas through the line 101b, the signal is transmitted to the multiplier 103 after its phase is shifted by 90° by a phase shifting circuit 102. These two signals are multiplied at a multiplier 103. The phase shifting circuit 102 shifts the phase by a capacitor C and a coil L.

In a conventional detector shown in FIG. 2, a ceramic resonator 104 is used in a phase shifting circuit 105. In the phase shifting circuit 105 of this method, as shown in FIG. 3, three resistors R and the ceramic resonator 104 form a Wheatstone bridge, and the phase of the FM signal is shifted by a reactance component of the ceramic resonator 104.

However, in the former phase shifting circuit, it is necessary to regulate the frequency by the capacitor or the coil, and such a regulation, which is a mechanical regulation, is liable to deterioration with age. In addition, since the coil cannot be formed in an integrated circuit (IC), the number of necessary externally-attached terminal pins of the IC increases, and an externally-attached part (i.e. coil) is required. In the latter phase shifting circuit, not only an externally-attached part is required but also the part (i.e. ceramic resonator) is not available in some countries since it is a special part. In addition, the ceramic resonator is inferior to the former method in characteristics, and is difficult to match with an IC.

SUMMARY OF THE INVENTION

An object of the present invention is to provide a phase shifting circuit which requires no regulation and no externally-attached part and all the elements of which can be formed in an IC.

To achieve the above-mentioned object, a phase shifting circuit of the present invention is provided with the following: an oscillation circuit which makes an oscillation by charging or discharging a capacitor and generates at both ends of the capacitor an oscillation signal having a constant level period and a saw tooth wave period alternately; an output circuit which generates a voltage of a predetermined level during the saw tooth wave period of the oscillation signal; and a pair of differential transistors having their output electrodes connected to the both ends of the capacitor, respectively. In order that a phase shift in accordance with a frequency of an input signal occurs in an output of the output circuit, a value of a current flowing through the capacitor is changed in the middle of the saw tooth wave period by activating or disabling the pair of differential transistors by the input signal.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
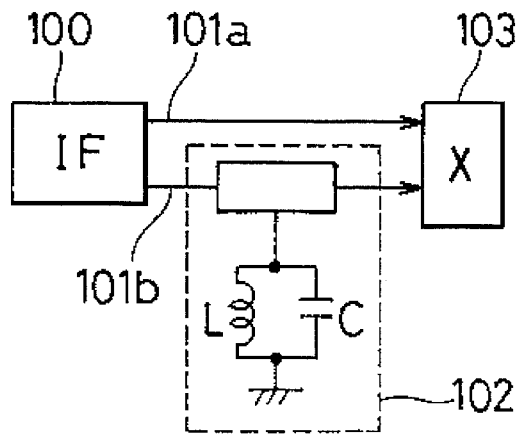
FIG. 1 is a circuit diagram of a conventional phase shifting circuit.
Figure 2:
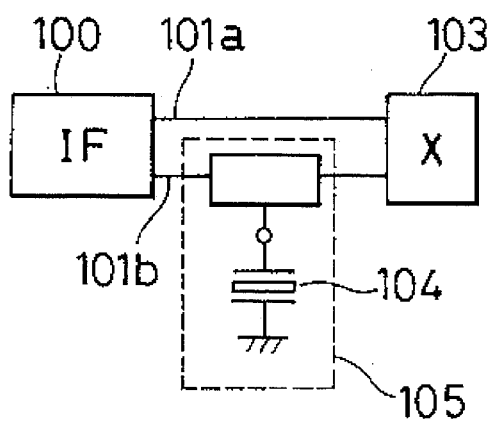
FIG. 2 is a circuit diagram of another conventional phase shifting circuit.
Figure 3:
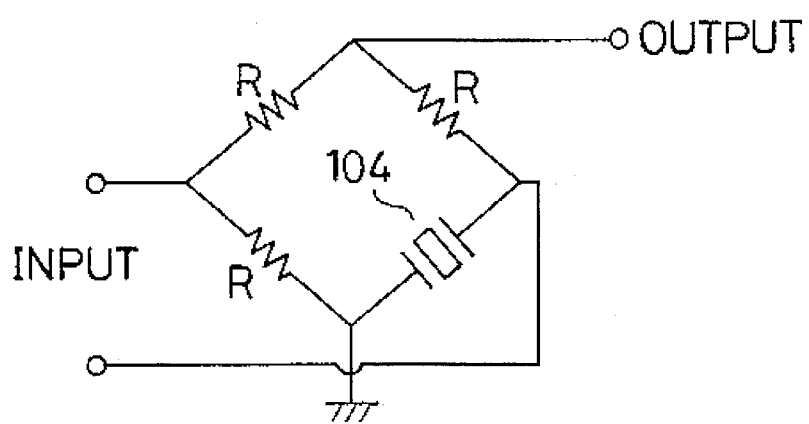
FIG. 3 is a circuit diagram showing the phase shifting circuit of FIG. 2 in detail.
Figure 4:
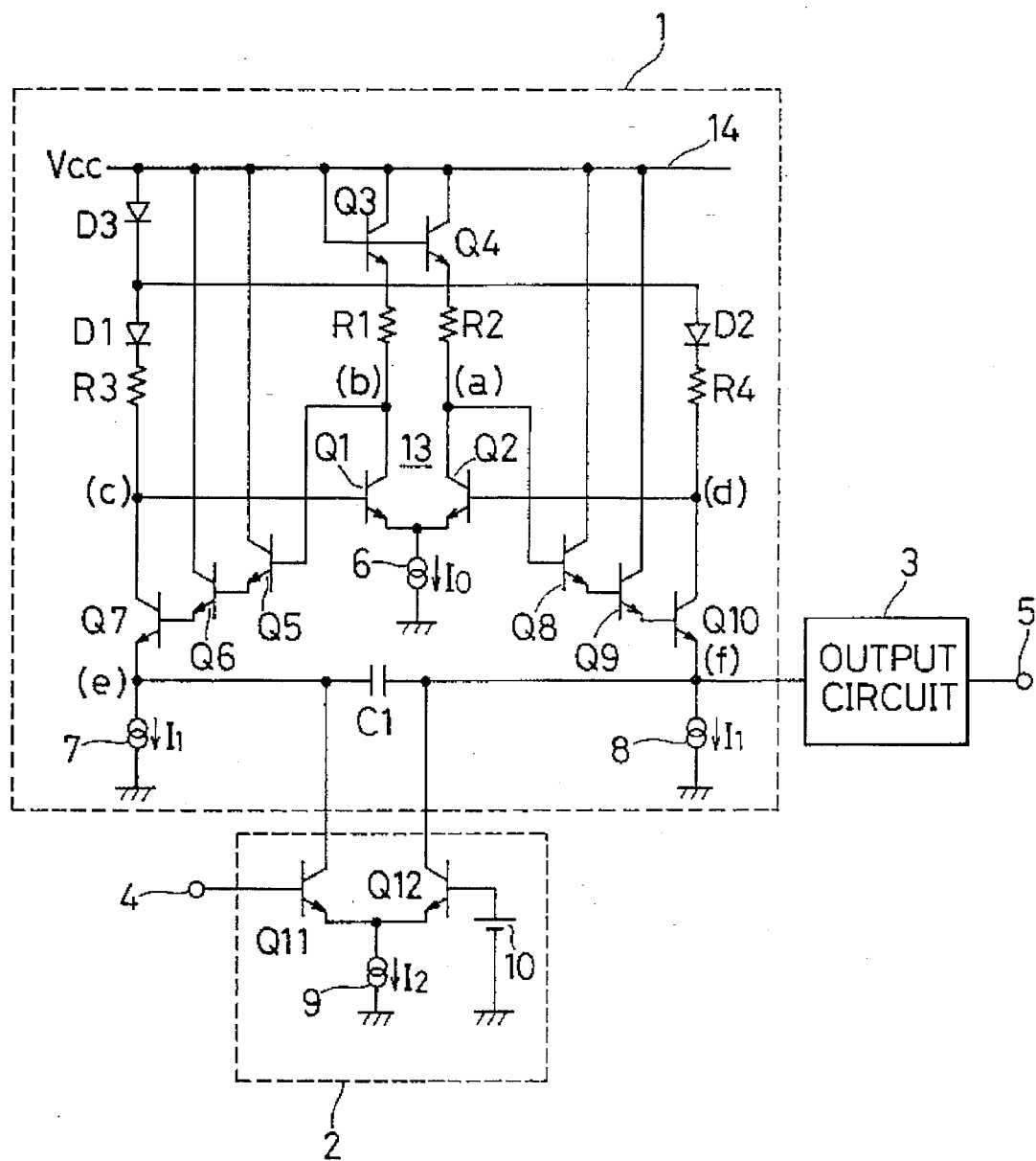
FIG. 4 is a circuit diagram of a phase shifting circuit embodying the present invention.

Hereinafter, the present invention will be described with reference to an embodiment shown in the figures. Referring to FIG. 4, there is shown a phase shifting circuit embodying the present invention. Reference numeral 1 represents an oscillation circuit. Reference numeral 2 represents a charging and discharging control circuit which controls charging and discharging values of a capacitor C1 of the oscillation circuit 1 in the middle of charging and discharging according to an input signal. Reference numeral 3 represents an output circuit which shapes an output of the oscillation circuit 1. Reference numeral 4 represents an input terminal for inputting an input signal (FM signal) thereto. Reference numeral 5 represents an output terminal. Although described later in detail, in the phase shifting circuit of FIG. 4, the shift amount of the phase depends on the point at which a charging or a discharging current of the capacitor C1 is changed. The circuit is set so that the phase is shifted by 90° for an input signal of a predetermined frequency. Specifically, the shift amount is 90° at the center frequency (i.e. carrier frequency) of the FM signal. In this case, the oscillation circuit 1 is designed so that its oscillation frequency is the center frequency of the FM signal.

The oscillation circuit 1 has a differential amplifying circuit 13 including a pair of differential transistors Q1 and Q2, their loading resistors R1 and R2, transistors Q3 and Q4 and a constant current source 6. One output of the differential amplifying circuit 13 is supplied from the collector of the transistor Q1 by way of Darlington-connected transistors Q5 and Q6 to the base of a transistor Q7, and the other output is supplied from the collector of the transistor Q2 by way of Darlington-connected transistors Q8 and Q9 to the base of a transistor Q10. The emitter of the transistor Q7 is connected to a constant current source 7 and to one end of the capacitor C1.

The collector of the transistor Q7 is connected by way of diodes D1 and D3 to a power supply line 14 of a voltage VCC, and to the base of the transistor Q1. Likewise, the collector of the transistor Q10 is connected by way of a resistor R4 and diodes D2 and D3 to the power supply line 14, and to the base of the transistor Q2. The emitter of the transistor Q10 is connected to a constant current source 8 and to the other end of the capacitor C1.

To the ends of the capacitor C1, the collectors of the differential transistors Q11 and Q12 forming the charging and discharging control circuit 2 are connected. The emitters of the differential transistors Q11 and Q12 are connected to a constant current source 9. The base of the differential transistor Q11 is connected to the input terminal 4, and the base of the differential transistor Q12 is connected to a constant voltage source 10.

Figure 7:
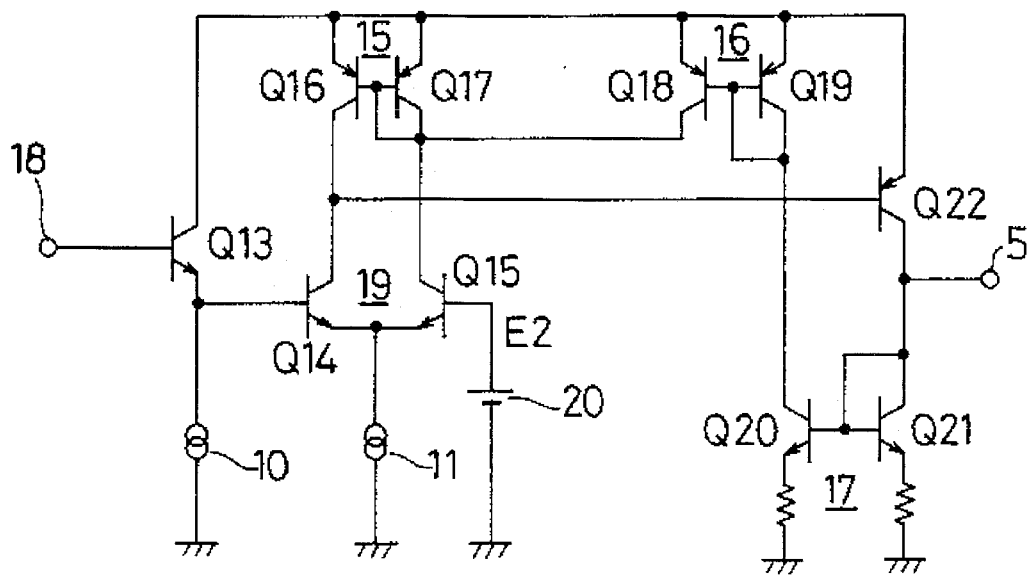
FIG. 7 is a view showing an output circuit in the phase shifting circuit of FIG. 4 in detail.

The output circuit 3 includes, as shown in FIG. 7 in detail, an emitter follower Q13 connected to one end of the capacitor C1 so as to receive an output of the oscillation circuit 1, differential transistors Q14 and Q15 which receive an output of the emitter follower Q13, constant current sources 10 and 11, current mirror circuits 15, 16 and 17, and a transistor Q22.

In describing the operation of the circuit of FIG. 4, first, only the operation of the oscillation circuit 1 will be described with reference to a time chart of FIG. 5. When the circuit of FIG. 4 is stable, the voltage of each point is as shown in a period (A) of FIG. 5. In actuality, however, an extremely slight offset is generated. Assume now that the potential at a point (d) is higher than the potential at a point (c). Then, the currents flowing to the transistors Q1 and Q2, respectively, have offsets $(I_0/2)-\Delta i$ and $(I_0/2)+\Delta i$ from $I_0/2$.

First, the side of the point (c) will be considered. The current flowing to the transistor Q1 decreases to increase the voltage at a point (b). That is, from $V_{cc}-V_F-R_0i_0/2$, $V_{cc}-V_F-R_0(I_0/2-\Delta i)$. This potential difference is transmitted to the transistors Q5, Q6 and Q7 in this order, so that the current flowing to the transistor Q7 increases. Since the voltage at the point (c) further decreases, an initial offset is amplified by a positive feedback, so that the potential difference between the points (c) and (d) increases. In addition, since of the currents flowing to the transistor Q7, the current exceeding $I_1$ is charged to the capacitor C1, the potential at a point (e) also increases. Likewise, since a current less than $I_1$ flows to the transistor Q10 and the shortage from $I_1$ is supplied from the capacitor C1, the potential at a point (f) decreases (see a transient period represented by a period (B) which occurs after the power is turned on).

During the period (B), the potential at the point (b) increases up to not more than $V_{cc}-V_F$. At this time, the potentials at the points (a) and (f) are $V_{cc}-V_{cc}-R_0I_0$ and $V_{cc}-4 V_F-R_0I_0$, respectively, and the difference in potential between the points (a) and (f) is $3 V_F$, so that the transistors Q8 to Q10 are activated to decrease the potential at the point (d) and increase the potential at the point (a) by $R_0I_0$. Thereby, the potential at the point (f) increases by $R_0I_0$ at a stretch. With this increase, the potential at the point (e) increases by $R_0I_0$. However, since the potential at the point (b) decreases because of the decrease in potential at the point (d), the transistors Q5 to Q7 cannot secure a base-emitter activation voltage $V_F$ and are cut-off (see the transition from the period (B) to a period (c)).

Since the transistor Q7 is thus cut-off, the potential at the point (e) is $I_1$ and the capacitor C1 is discharged, so that the potential at the point (e) drops by $I_1t/C_1$ (t represents time). At this time, since the potentials at the points (a) to (d) do not change, the potential at the point (f) is maintained $V_{cc}-4 V_F$ (period (C)).

When the potential at the point (e) decreases to $V_{cc}-4 V_F-R_0I_0$, the potential between the points (b) and (e) becomes $3 V_F$ to activate the transistors Q5 to Q7, so that the potential at the point (c) decreases and the potential at the point (b) increases by $R_0I_0$. Since the point (e) is clamped at a potential lower than the potential at the point (b) by $-3 V_F$, the potential at the point (e) is increased by $R_0I_0$. This means that the potentials at the both ends of the capacitor C1 do not change since the increase in the potential at the point (e) occurs during a very short period of time when no currents flow into and out of the capacitor C1. Therefore, the potential at the point (f) also increases by $R_0I_0$. At this time, since the potential at the point (c) decreases, the potential at the point (a) decreases, so that the transistors Q8 to Q10 are cut-off (transition from the period (C) to a period (D)).

During the period (D), the potential at the point (f) drops by $I_1t/C_1$ like during the period (C). When the potential at the point (f) decreases to $V_{cc}-4V_F-R_0I_0$, the potential $3V_F$ is secured between the points (a) and (f), so that the transistors Q8 to Q10 are activated and the transistors Q5 to Q7 are cut-off. A period (E) is similar to the period (C).

Figure 5:
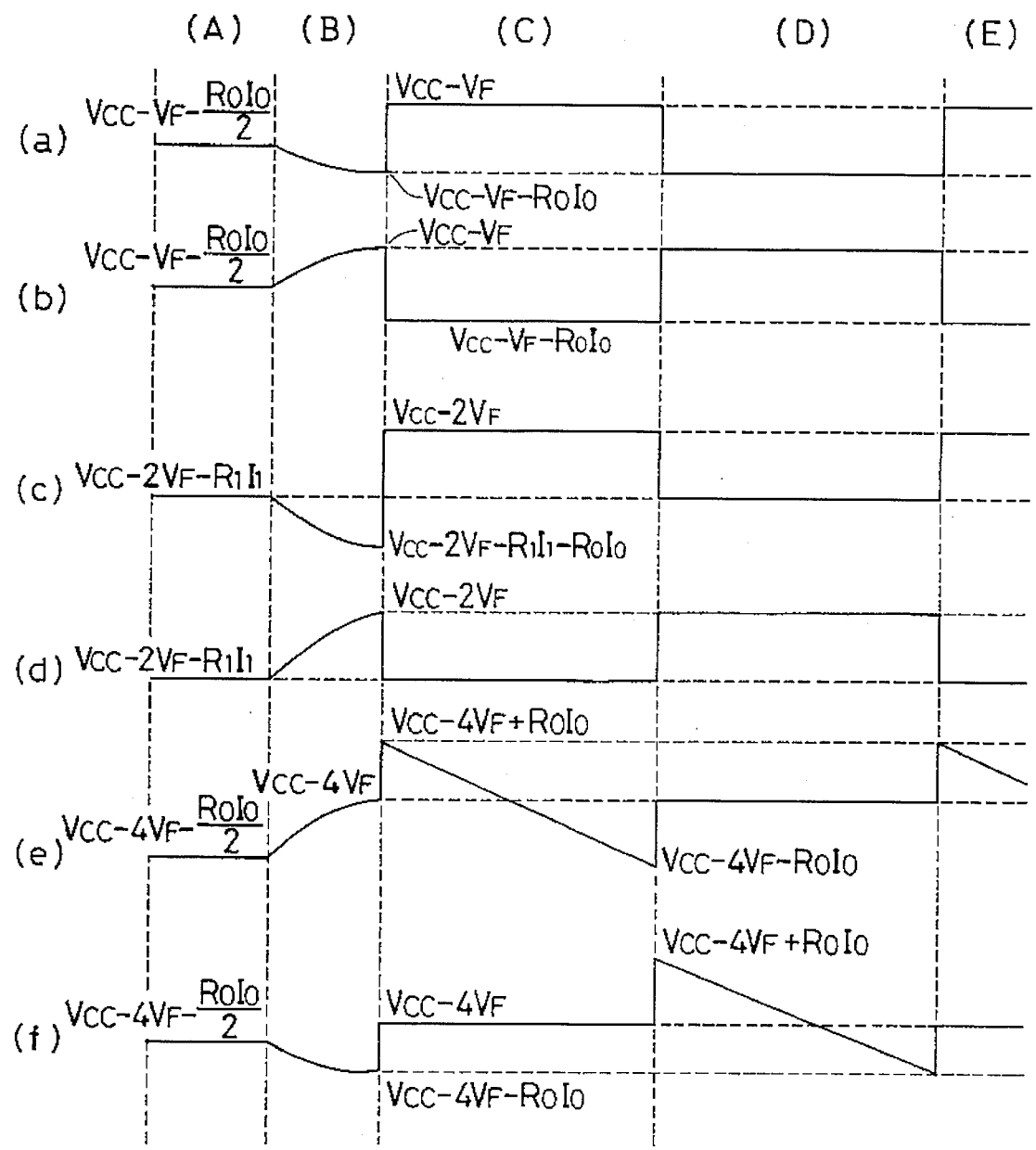
FIGS. 5(a)–5(f) are views of assistance in explaining an operation of an oscillation circuit in the phase shifting circuit.

As described above, in the operation by the oscillation circuit alone, the voltages at the points (e) and (f) at the both ends of the capacity C1 vary as shown at (e) and (f) of FIG. 5. This variation is an alternate repetition of the periods (C) and (D) of FIG. 5 in the stationary state. In other words, the oscillation circuit 1 generates to the both ends of the capacitor an oscillation signal having a constant level period (C) and a saw tooth wave period (D) alternately.

Figure 6:
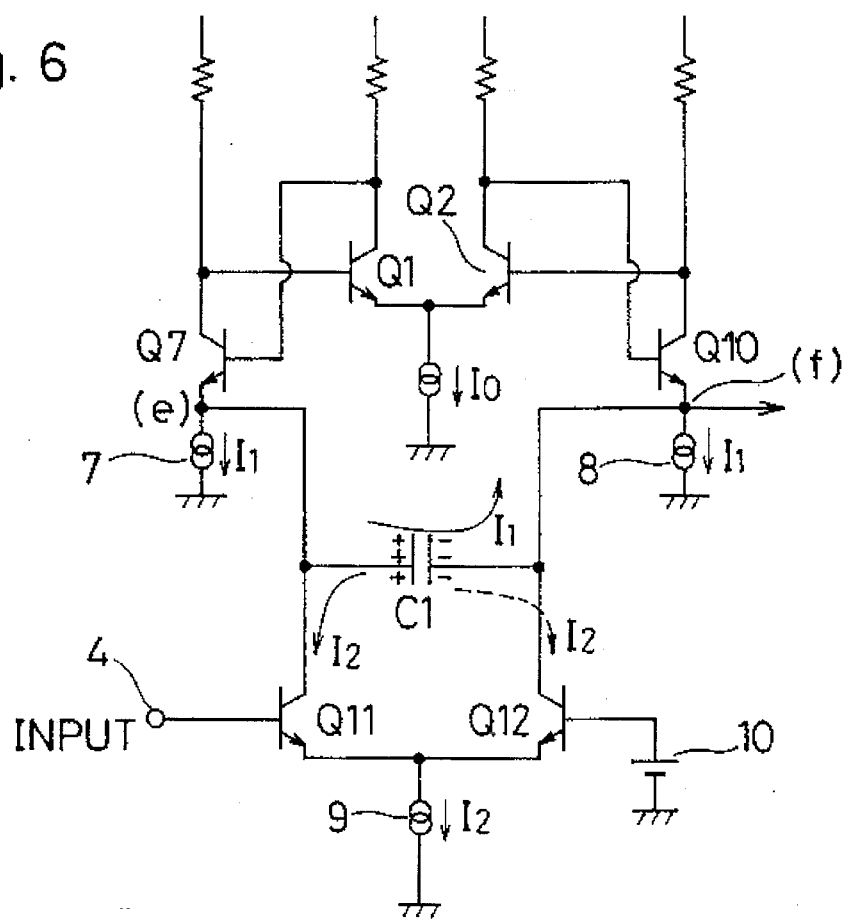
FIG. 6 is a partial circuit diagram of assistance in explaining an operation of a charging and discharging control circuit in the phase shifting circuit.
Figure 8:
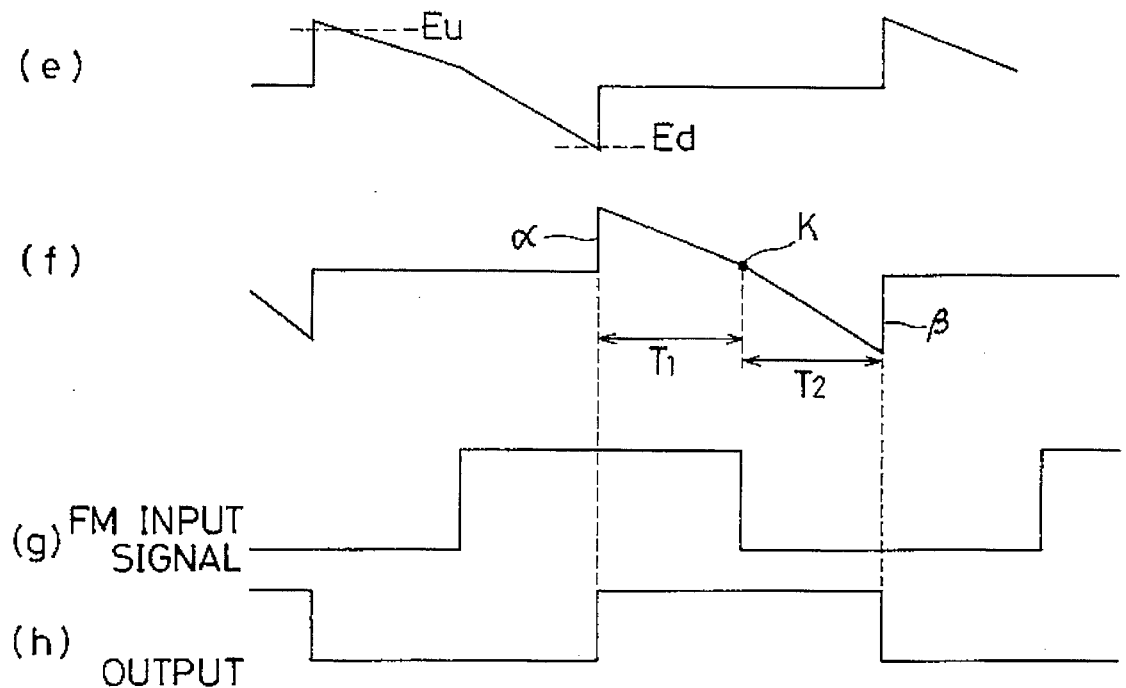
FIGS. 8(e)–8(h) are signal waveform charts of assistance in explaining operations of the charging and discharging control circuit and the output circuit.

Subsequently, an operation will be described which is performed when the charging and discharging control circuit 2 is caused to work on the oscillation circuit 1. Here, the currents of the constant current sources 7 and 8 are represented by $I_1$, and the current of the constant current source 9 is represented by 12. Between these currents, a relationship $I_1>I_2$ holds. When the transistor Q7 is ON and the transistor Q10 is OFF, through the capacitor C1, the current $I_1$ flows in a direction shown in FIG.6, so that the potential at the point (f) decreases. At this time, when an FM signal as shown in FIG. 8 is input to the input terminal 4, since the transistor Q11 is ON and the transistor Q12 is OFF during a period $T_1$ of the FM signal, the current $I_1$ flows rightward and the current $I_2$ flows leftward through the capacitor C1 during the period $T_1$. At this time, the current $I_2$ flows into the constant current source 9 by way of the transistor Q11.

During the period $T_2$, since the conditions of the transistors Q11 and Q12 are reversed, i.e. the transistor Q11 is OFF and the transistor Q12 is ON, through the capacitor C1, the current $I_2$ shown by the dotted line flows rightward during the period $T_2$ as well as the current $I_1$ flows rightward (the current $I_2$ flows by ways of the transistor Q12 to the current source 9).

Referring to the waveforms of FIG. 8, at (f), the inclination during the period $T_2$ is steeper than the inclination during the period $T_1$. When the charging and discharging control circuit 2 is absent, only the current $I_1$ flows to the capacitor C1. Compared to the case where the current $I_1$ flows, since a current $I_1-I_2$, i.e. a current smaller than $I_1$ flows during the period $T_1$, the inclination is less steep when the current $I_1-I_2$ flows than when only the current $I_1$ flows. On the other hand, during the period $T_2$, since a current $I_1+I_2$ which is greater than the current $I_1$ flows, the inclination is steeper than when only the current $I_1$ flows. The oscillation frequency of the oscillation circuit 1 is the same as the center frequency (carrier frequency) of the FM signal. The phase shifting circuit operates so that the relationship between (f)

of FIG. 8 and the FM input signal (g) is the phase relationship as shown in FIG. 8. That is, $T_1$ equals $T_2$. $T_1$ does not equal $T_2$ immediately after the phase shifting circuit is activated since the phase of the FM input signal with respect to the phase of the oscillation signal is random. The phase shifting circuit is, however, automatically controlled to be operated so that $T_1$ equals $T_2$. The reason therefor is as follows. The period $T_1+T_2$ is a period during which only the current $I_1$ flows to the capacitor C1. If the reduction in charge due to the current $I_1-I_2$ is compensated for by the increase in charge due to the current $I_1+I_2$, the condition of the capacitor C1 is the same as that of the case where only the current $I_1$ flows. This condition is fulfilled if $T_1$ equals $T_2$. Thus, the circuit is automatically controlled so that $T_1$ equals $T_2$. However, if the frequency of the input signal deviates from the center frequency, $T_1$ does not equal $T_2$, and the amount of phase shift varies accordingly.

The voltage of (f) of FIG. 8 is shaped into a pulse waveform at the succeeding output circuit 3. In the output circuit shown in FIG. 7, the voltage at the point (f) is input to an input terminal 18. In a differential amplifying circuit 19 including the transistors Q14 and Q15, when no input is present, the transistor Q15 biased ($E_2$) by a direct current (DC) source 20 is ON and the transistor Q14 is OFF. Under this condition, since the current mirror circuit 15 is ON and the current output from the transistor Q16 is supplied to the base of the transistor Q22, the transistor Q22 is OFF, so that the current mirror circuit 17 is OFF and the current mirror circuit 16 is OFF. At this time, the level of the voltage at the output terminal 5 is low because of an association with a non-illustrated circuit connected thereto.

When a voltage higher than a threshold value Eu of the transistor Q14 is inputted under this condition, the transistor Q14 is activated in addition to the transistor Q15 which is ON. Consequently, the collector current of the transistor Q16 flows into the transistor Q14, and the transistor Q22 is activated so that the base current thereof also flows into the transistor Q14. The activation of the transistor Q22 changes the level of the output terminal 5 to high and activates the current mirror circuits 17 and 16 successively, so that the collector current of the transistor Q18 flows to the transistor Q15. The current of the current mirror circuit 15 decreases accordingly.

Figure 9:
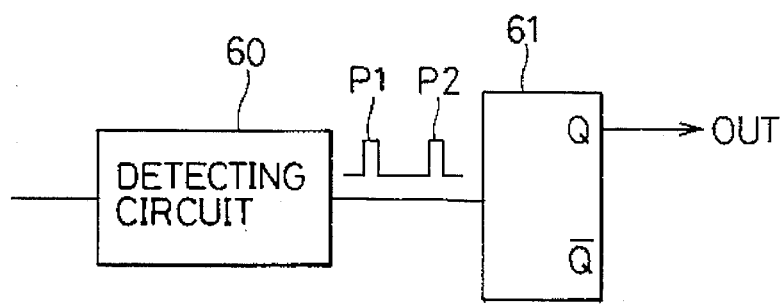
FIG. 9 is a view of another example of the output circuit in the phase shifting circuit.

Since for this reason, the output current of the transistor Q16 is small even through the input voltage successively decrease during the period $T_1$ of FIG. 8, the transistor Q22 is not readily disabled. This condition is a hysteresis condition, and the level of the output terminal 5 is maintained high. When the input is further decreased to Ed, the transistors Q14 and Q22 are disabled to disable the current mirror circuits 17 and 16, so that the circuit is returned to the initial condition and the level of the output terminal 5 is changed to low. By the operation described above, a high-level pulse (see (h) of FIG. 8) is output to the output terminal 5 during the period $(T_1+T_2)$. The phase of the output is shifted by 90° from the phase of the input signal. To further explain, during the constant level period of the oscillation signal (f), a low level output is generated, and during the saw tooth wave period, a high level output is generated. The phases of the outputs are shifted by 90° from the phase of the input signal. The output circuit may be constituted by a flip flop 61 as shown in FIG. 9. In this case, a detecting circuit 60 is provided to detect a rise α at the start of the saw tooth wave and a rise β at the end of the saw tooth wave, and the flip flop 61 is triggered by detection outputs $P_1$ and $P_2$ of the detecting circuit 60.

In this circuit, since the phase is shifted by 90° at a predetermined frequency (carrier frequency), when an input has a frequency different from the predetermined frequency, the points of change of the periods $T_1$ and $T_2$ shift rightward or leftward to change the length of the period $(T_1+T_2)$, so that the amount of the phase shift of the output for the input differs.

Figure 10:
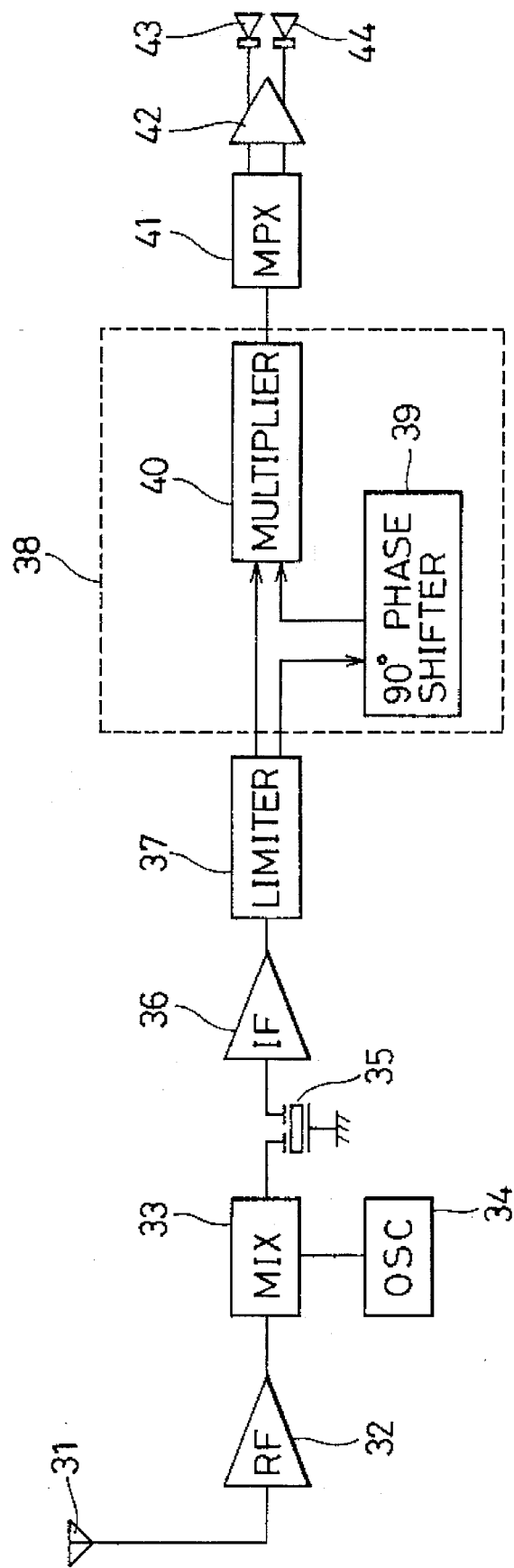
FIG. 10 a block circuit diagram of an FM radio receiver using the phase shifting circuit of the present invention.

Referring to FIG. 10, there is shown an example where the above-described phase shifting circuit is used in an FM radio receiver. Reference numeral 31 represents an antenna. Reference numeral 32 represent a radio frequency (RF) amplifier. Reference numeral 33 represents a mixer which obtains a difference in frequency between an oscillation signal of a local oscillation circuit 34 and an RF signal from the RF amplifier 32 to output an IF signal. Reference numeral 35 represents an IF filter. Reference numeral 36 is an IF amplifying circuit. Reference numeral 37 is a limiter. Reference numeral 38 represents a quadrature detection circuit including a 90° phase shifting circuit 39 and a multiplier 40. This circuit is provided to demodulate an input FM signal. Reference numeral 41 represents a multiplexer. Reference numeral 42 represents an output circuit. Reference numerals 43 and 44 represent left and right speakers, respectively.

In this example, the previously-described phase shifting circuit is used as the 90° phase shifting circuit 39 of the quadrature detection circuit 38. The quadrature detection circuit 38 is formed in a single IC together with the IF amplifier 36, the limiter 37 and the multiplexer 40. Since it requires no externally-attached part, the 90° phase shifting circuit 39 is advantageous for use in an IC and in an FM radio receiver.

As described above, according to the present invention, since the phase shifting circuit does not use a coil or a ceramic resonator but changes the values of charging and discharging currents of the oscillation capacitor based on an input signal, when the phase shifting circuit is formed in an IC, no externally-attached part is required. Thus, since regulation is necessary only within the IC, setting makers (users of the IC) of FM receivers are not caused any inconvenience. In addition, since no special part such as the ceramic resonator is required, the circuit can be manufactured in countries where such a special part is not available.

Obviously, many modifications and variations of the present invention are possible in light of the above teachings. It is therefore to be understood that within the scope of the appended claims, the invention may be practiced other than as specifically described.

What is claimed is:

1. A phase shifting circuit comprising:

an oscillation circuit which makes an oscillation by charging or discharging a capacitor said oscillation circuit generating at both ends of the capacitor an oscillation signal having a constant level period and a saw tooth wave period alternately;

an output circuit, connected to said oscillation circuit, which generates a voltage of a predetermined level during the saw tooth wave period of the oscillation signal; and a pair of differential transistors having their output electrodes connected to the both ends of the capacitor, respectively, wherein in order that a phase shift in accordance with a frequency of an input signal occurs in an output of the output circuit, a value of a current flowing through the capacitor is changed in the middle of the saw tooth wave period by activating or disabling the pair of differential transistors by the input signal, wherein said oscillation circuit includes first and second transistors which are alternately activated, and first and second constant current sources of a current $I_1$ which are connected to the first and second transistors, respectively, and wherein the first transistor and the first constant current source are connected to a first end of the capacitor, and the second transistor and the second constant current source are connected to a second end of the capacitor, and wherein when the first transistor is ON and the second transistor is OFF, the current $I_1$ flows from the first transistor through the capacitor to the second constant current source, and when the first transistor is OFF and the second transistor is ON, the current $I_1$ flows from the second transistor through the capacitor to the first constant current source.

2. A phase shifting circuit according to claim 1, wherein the pair of differential transistors are connected to a third constant current source of a current $I_2$ which is smaller than the current $I_1$, and wherein when the first transistor is ON and the second transistor is OFF, a condition of the phase shifting circuit is changed from a first condition where a current $I_1-I_2$ flows through the capacitor to a second condition where a current $I_1+I_2$ flows through the capacitor by activating or disabling the pair of differential transistors.

3. A phase shifting circuit according to claim 2, wherein the input signal is an FM signal, and wherein a period of the first condition and a period of the second condition equal each other at a carrier frequency of the FM signal, and wherein a phase of an output signal of the output circuit is shifted by 90° from a phase of the input signal.

4. A phase shifting circuit comprising:
   an oscillation circuit including:
   a first constant current source of a current $I_1$ having a first end connected to a ground potential point and having a second end connected to an emitter of a first transistor of npn type;
   a second constant current source of a current $I_1$ having a first end connected to a ground potential point and having a second end connected to an emitter of a second transistor of npn type;
   a capacitor connected between the emitter of the first transistor and the emitter of the second transistor;
   a first charging and discharging control circuit, connected to bases of the first and second transistors, which, when one of the first and second transistor is activated to charge the capacitor to therein increase an emitter potential to disable one of the first and second transistors, the other of the first and second transistors is activated to charge the capacitor in an opposite direction,
   wherein an oscillation signal having a constant level period and a saw tooth wave period alternately is generated at both ends of the capacitor, and a frequency of the oscillation signal is the same as a carrier frequency of an FM signal whose phase is to be shifted;
   an output circuit connected to a first end of the capacitor, said output circuit generating a first level during the constant level period of the oscillation signal and generating a second level during the saw tooth wave period of the oscillation signal; and
   a second charging and discharging controlling circuit including first and second pairs of differential transistors having their collectors connected to the both ends of the capacitor, respectively, and having their emitters connected to a third constant current source of a current $I_2$ which is smaller than current $I_1$, wherein a following two conditions occur by activating or disabling the first and second pairs of differential transistors by the FM signal: a first condition where a current $I_1-I_2$ flows through the capacitor and a second condition where a current $I_1+I_2$ flows through the capacitor, and wherein a period of the first condition and a period of the second condition equal each other at the carrier frequency, and wherein a phase of a signal output from the output circuit is shifted by 90° from the input FM signal.

5. A phase shifting circuit which shifts, by a predetermined amount, a phase of an FM signal supplied to a first input terminal of an FM detection multiplier, and supplies a second input terminal of the multiplier with the FM signal having its phase shifted, said phase shifting circuit comprising:
   an oscillation circuit including:
   a first constant current source of a current $I_1$ having a first end connected to a ground potential point and having a second end connected to an emitter of a first transistor of npn type;
   a second constant current source of a current $I_1$ having a first end connected to a ground potential point and having a second end connected to an emitter of a second transistor of npn type;
   a capacitor connected between the emitter of the first transistor and the emitter of the second transistor;
   a first charging and discharging control circuit, connected to bases of said first and second transistors, which, when one of the first and second transistors is activated to change the capacitor to therein increase an emitter potential to disable one of the first and second transistors, the other of the first and second transistors is activated to charge the capacitor in an opposite direction,
   wherein an oscillation signal having a constant level period and a saw tooth wave period alternately is generated at both ends of the capacitor, and a frequency of the oscillation signal is the same as a carrier frequency of an FM signal whose phase is to be shifted;
   an output circuit connected to a first end of the capacitor, said output circuit generating a first level during the constant level period of the oscillation signal and generating a second level during the saw tooth wave period of the oscillation signal; and
   a second charging and discharging control circuit including first and second pairs of differential transistors having their collectors connected to the both ends of the capacitor, respectively, and having their emitters connected to a third constant current source of a current $I_2$ which is smaller than the current $I_1$, wherein a following two conditions occur by activating or disabling the first and second pairs of differential transistors by the FM signal: a first condition where a current $I_1-I_2$ flows through the capacitor and a second condition where a current $I_1+I_2$ flows through the capacitor, and wherein a period of the first condition and a period of the second condition equal each other at the carrier frequency, and wherein a phase of a signal output from the output circuit is shifted by 90° from the FM input signal.

6. A phase shifting circuit which shifts by 90° a phase of an input signal supplied to a quadrature detector, said phase shifting circuit comprising:
   an oscillation circuit including:
   a first constant current source of a current $I_1$ having a first end connected to a ground potential point and having a second end connected to an emitter of a first transistor of npn type;

a second constant current source of a current $I_1$ having a first end connected to a ground potential point and having a second end connected to an emitter of a second transistor of npn type;

a capacitor connected between the emitter of the first transistor and the emitter of the second transistor;

a first charging and discharging control circuit, connected to the bases of the first and second transistors, which, when one of the first and second transistors is activated to charge the capacitor to therein increase an emitter potential to disable one of the first and second transistors, the other of the first and second transistors is activated to charge the capacitor in an opposite direction, wherein an oscillation signal having a constant level period and a saw tooth wave period alternately is generated at both ends of the capacitor, and a frequency of the oscillation signal is the same as a frequency of the input signal whose phase is to be shifted;

an output circuit connected to a first end of the capacitor, said output circuit generating a first level during the constant level period of the oscillation signal and generating a second level during the saw tooth wave period of the oscillation signal; and a second charging and discharging control circuit including first and second pairs of differential transistors having their collectors connected to the both ends of the capacitor, respectively, and having their emitters connected to a third constant current source of a current $I_2$ which is smaller than the current $I_1$, wherein a following two conditions occur by activating or disabling the first and second pairs of differential transistors by the FM signal: a first condition where a current $I_1-I_2$ flows through the capacitor and a second condition where a current $I_1+I_2$ flows through the capacitor, and wherein a period of the first condition and a period of the second condition equal each other, and wherein a phase of a signal output from the output circuit is shifted by 90° from the input signal.

* * * * *